United States Patent [19]

Hendricks et al.

[11] 4,340,461
[45] Jul. 20, 1982

[54] MODIFIED RIE CHAMBER FOR UNIFORM SILICON ETCHING

[75] Inventors: Charles J. Hendricks; William W. Hicks, both of Wappingers Falls; John H. Keller, Newburgh, all of N.Y.

[73] Assignee: International Business Machines Corp., Armonk, N.Y.

[21] Appl. No.: 185,831

[22] Filed: Sep. 10, 1980

[51] Int. Cl.³ .................... C23C 15/00; C23F 1/00
[52] U.S. Cl. .................... 204/298; 156/345; 156/643; 204/192 E
[58] Field of Search .................... 204/192 E, 298; 156/345, 643

[56] References Cited

U.S. PATENT DOCUMENTS

| 3,410,774 | 11/1968 | Barson et al. | 204/192 |
| 3,733,258 | 2/1971 | Hanak et al. | 204/192 |
| 4,119,881 | 10/1978 | Calderon | 313/360 |
| 4,148,705 | 4/1979 | Battey et al. | 204/192 E |
| 4,209,357 | 6/1980 | Gorin et al. | 156/643 |

FOREIGN PATENT DOCUMENTS 55-39690  3/1980  Japan ............................ 204/192 E

OTHER PUBLICATIONS

A. Galicki et al., "Plasma Reaction Chamber", IBM Technical Disclosure Bulletin, vol. 20, No. 6, Nov. 1977, p. 2211.

L. M. Ephrath, "Selective Etching of Silicon Dioxide Using Reactive Ion Etching with CF₄-H₂", J. Electrochem. Soc.: SOLID-STATE SCIENCE AND TECHNOLOGY, Aug. 1979, pp. 1419-1421.

J. J. Cuomo et al., "Device for Controlling Ion-Beam Size", IBM Technical Disclosure Bulletin, vol. 21, No. 7, Dec. 1978, pp. 3036, 3037.

*Primary Examiner*—Aaron Weisstuch
*Attorney, Agent, or Firm*—John A. Jordan

[57] ABSTRACT

A plasma enhancing baffle plate is employed in conjunction with the anode of an RIE system to provide uniform silicon etching. The baffle plate is conductively coupled to and provided in relatively close proximity to the anode to form a constricted chamber region between anode and baffle plate. With the constricted chamber open to the RIE chamber through aperture means in the baffle plate the total surface area of the anode is increased, such that when the system is biased to operate in an RIE mode an increase in the generation of neutral etching species is effected. Various aperture arrangements may be employed to provide different patterns of neutral etching species generation, in accordance with the peculiar characteristics of the system employed.

9 Claims, 6 Drawing Figures

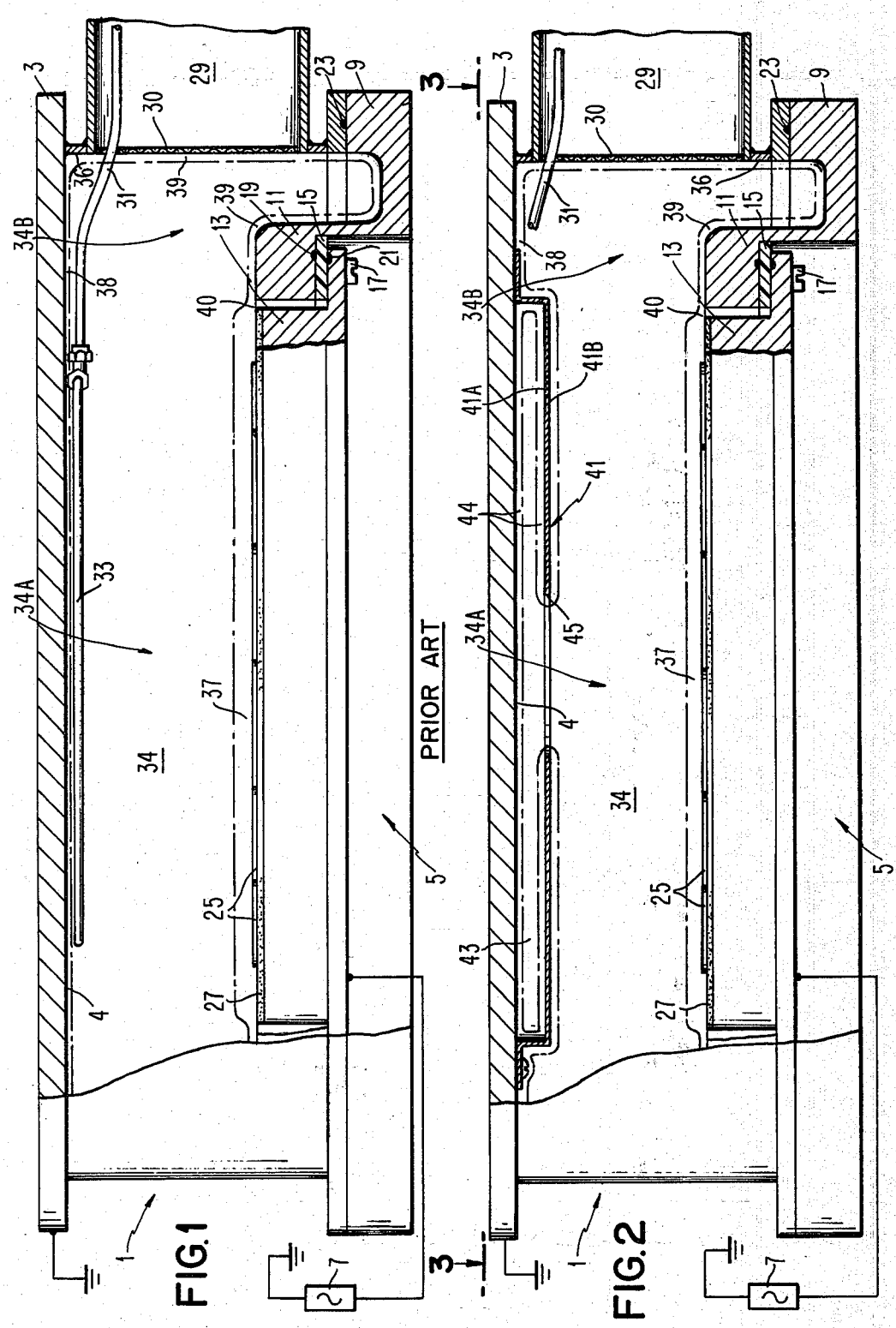

MODIFIED RIE CHAMBER FOR UNIFORM SILICON ETCHING

BACKGROUND OF THE INVENTION

1. Field of the Invention

The present invention relates to reactive ion etching and, more particularly, to reactive ion etching using a modified reaction chamber which gives uniform silicon etching in batch processing silicon wafers.

2. Description of the Problem and the Prior Art

The clear trend in integrated circuit design is one of increasing density with a corresponding decrease in the minimum size of device features and interconnect structures. To economically fabricate devices with minimum geometric pattern sizes in a range of 1-2 microns, advanced technology manufacturing processes and tools are required. This is particularly true in the areas of pattern generation and pattern transfer to substrate material. Electron beam and X-ray lithography systems have been developed to fill the need for the generation of fine patterns in photoresist materials. However, there is a need for process technology and manufacturing capabilities which will permit transfer of the patterns to the thin substrate materials with a minimum of distortion.

The more conventional approaches, such as wet chemical and low-pressure plasma etching, are insufficient to meet the new process technology requirements for transferring fine patterns because such etching techniques are essentially isotropic processes which result in a large amount of feature undercutting. Ion milling and sputter etching provide directional etching with little undercutting but suffer the disadvantages of photoresist degradation, charge damage, low etch rates, poor selectivity and redeposition in the etched feature. Reactive ion etching, on the other hand, is a directional etching technique which does not have the disadvantages incident the use of ion milling and sputter etching.

Reactive ion etching (RIE) has been shown to be widely applicable to a variety of thin film materials and compatible with commonly utilized photoresist systems. However, one of the difficulties encountered in RIE has been obtaining etch rate uniformities suitable for manufacturing semiconductor devices. Non-uniformity of etching has been addressed in a variety of prior art etching devices. For example, U.S. Pat. No. 4,148,705 to Battey et al. describes a plasma etching reactor arrangement for etching, for example, aluminum wherein the plasma is generated between a pair of closely spaced electrodes and a distributed impedance is provided in series with the plasma to assure uniform distribution of the ionizing current and the glow discharge of the plasma throughout the region between the electrodes. In another approach, Galicki et al. describe in the IBM Technical Disclosure Bulletin, Vol. 20, No. 6, November 1977, page 2211, a plasma etch reaction chamber arrangement which provides a uniform flow of gas in the chamber.

A reactive ion etching chamber arrangement for the selective etching of silicon dioxide has been described by L. M. Ephrath in *J. Electrochemical Soc.: Solid-State Science and Technology*, Aug. 1979, pp. 1419-1421. Ephrath employs for the wafers an aluminum plate which is mechanically and electrically connected to a water cooled RF cathode. A grounded counterelectrode is placed in close proximity to the surface of the wafers to reduce the backscattering of aluminum.

A further plasma etch reaction chamber that attempts to achieve gas uniformity in a batch wafer processing arrangement is that described by Yamamoto et al in U.S. Pat. No. 4,151,034.

In scaling up RIE chambers to form silicon-wafer large-batch processing tools for manufacturing, etch rate uniformity becomes even more of a problem because of the larger areas involved. In such tools, the etch rate of materials like silicon can be relatively non-uniform. Typically, a non-uniformity of 35 percent has been observed in batch processing silicon wafers in a multi-wafer etching mode involving a dozen or more wafers. This nonuniformity of etch rate can occur even though the partial pressure of the injected gas, as well as the plasma density of the etching plasma, is uniform over the chamber volume. One explanation for this nonuniformity of etch rate is that although the etchant species is generated uniformly over the entire chamber volume/surface, the dominant loss occurs at the target, and thus an etchant species concentration gradient is created which leads to an enhanced etch rate at the outer edge of the target.

In accordance with the principles of the present invention, uniform etching of batches of silicon substrates is achieved in an enlarged RIE chamber by providing a mechanism within the chamber for adjusting the etchant species concentration across the target so as to be uniform. The mechanism is comprised of a plasma enhancing baffle plate (PEBP) placed in the general region above the target in such a way that it encloses a plasma volume between itself and the anode (non-target electrode). This enclosed volume is connected to the main chamber volume by providing apertures in the PEBP of various sizes, shapes and locations. The concentration of etchant species in the target region in the presence of the PEBP represents a significant increase over that with no plate. The reason for this is the increased anode area represented by the PBEP increases the RF currents and, hence, ionizing currents in the region near the PEBP. In addition, since these currents must pass through the apertures in the PEBP, they are constricted in the region of the apertures leading to a high rate of etchant species production at the aperture locations. By adjusting aperture size and location the etchant species density may be varied over the target to produce a uniform etch rate.

It is, therefore, an object of the present invention to provide an improved etching method and apparatus.

It is a further object of the present invention to provide an improved reactive ion etch apparatus.

It is yet a further object of the present invention to provide an improved silicon etching apparatus.

It is yet still a further object of the present invention to provide an improved RIE apparatus for batch etching silicon substrates.

It is another object of the present invention to provide an improved RIE apparatus for batch etching a large number of silicon substrates with etching being relatively uniform over the etching field from wafer to wafer.

BRIEF DESCRIPTION OF THE DRAWINGS

FIG. 1 shows a schematic illustration of a typical prior art RIE apparatus.

FIG. 2 shows a schematic illustration of the RIE apparatus with a plasma enhancing baffle plate in accordance with the present invention.

DESCRIPTION OF THE PREFERRED EMBODIMENTS

Figure 3:
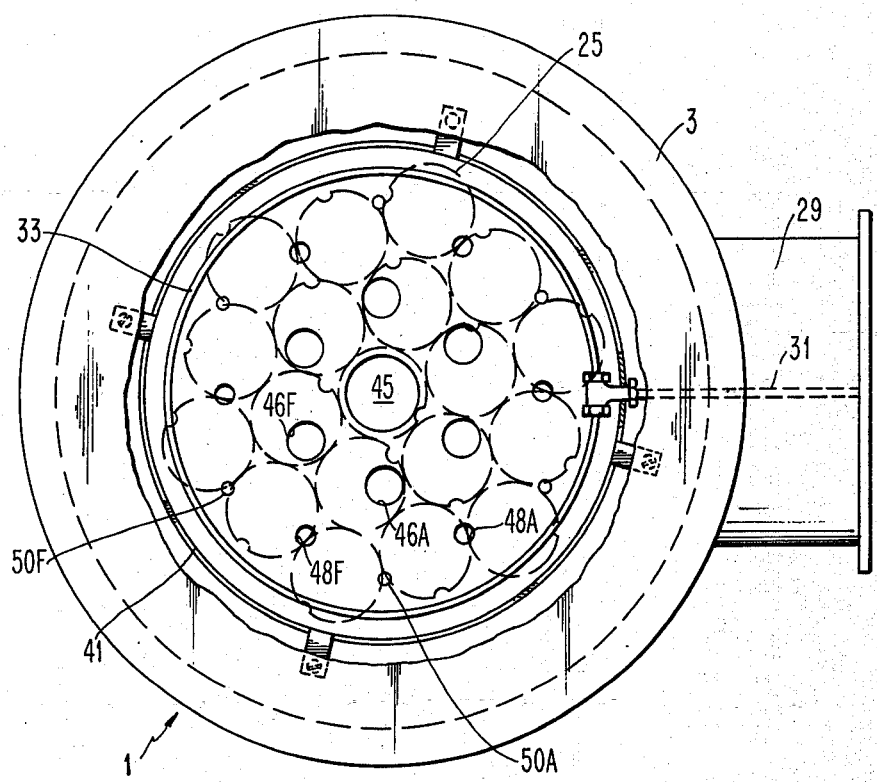
FIG. 3 shows a top view in partial section of the RIE apparatus of FIG. 2.

FIG. 1 shows a typical prior art RIE chamber 1 employing a "tophat" cathode target arrangement. As shown, anode 3 with interior surface 4 is grounded and cathode top plate 13 of cathode assembly 5 is coupled to RF source 7. The "tophat" cathode target assembly arrangement comprises a rounded brim portion 9 integral with wall portion 11 extending upwardly into the RIE chamber. Top plate 13 of the "tophat" is electrically insulated from wall portion 11 by insulating spacer 15 and held in place by screws, one of which is shown at 17. A seal between the interior of the RIE chamber and atmosphere is achieved via O rings 19 and 21 on opposing sides of spacer 15. In addition, a seal between the interior of the chamber and atmosphere around the brim portion of the "tophat" is achieved via O ring 23. As shown, pallet 27 rests upon top plate 13 and accommodates a plurality of workpieces 25, the latter typically being silicon substrates. Pumpdown of the chamber is achieved through port 29 which is separated from the main chamber volume by screen 30. The gas inlet 31 and gas ring 33 permit introduction and distribution of the appropriate process gas into the chamber.

During operation of the system of FIG. 1, a plasma glow will exist within the interior plasma region 34 of chamber 1. To facilitate a clear understanding of the operation of prior art systems, the explanation to follow divides the interior chamber plasma region into central plasma region 34A situated over cathode 13 and outer plasma region 34B situated nearer the chamber walls. During operation, plasma is separated from the inside chamber surfaces, including the surfaces of pallet 27, screen 30 and chamber wall 36, by a plasma sheath. The character of the plasma sheath is determined by its particular location within the chamber. The cathode plasma sheath 37 is the widest (typically $\simeq 1$ cm), has a high potential drop across it (typically 300–500 V d.c.) and is normally observed as a distinct dark region between the cathode and the plasma glow. The anode plasma sheath 38 and the wall plasma sheath 39 are generally the same for the system as configured, with a thickness typically $\sim 1$ mm and voltage drop of $\sim 20$ V. The various dark spaces merge continuously into each other, as depicted near cathode edge 40. Although not shown in FIG. 1, it is to be understood that a plasma sheath also exists around gas inlet 31.

FIG. 2 shows the prior art RIE chamber shown in FIG. 1, modified in accordance with the present invention to include the plasma enhancing baffle plate (PEBP) 41 with upper surface 41A and lower surface 41B. For the sake of clarity of explanation, the gas inlet ring 33 has been omitted, but it is to be understood that the ring or some like form of gas introduction/distribution mechanism is provided within the chamber. The particular PEBP shown in FIG. 2 has a single large aperture 45 connecting the enclosed plasma region 43 to the plasma region 34A. Aperture 45 permits the creation of an enclosed plasma in region 43 resulting in an anode plasma sheath 44 at both the surface of plate 3 and the upper surface 41A of the PEBP. In addition, a sheath is formed on lower surface 41B of the PEBP.

FIG. 3 shows, as an example, a top view of a typical baffle plate arrangement, such arrangement having more particular aperture design detail over that shown in FIG. 2. As can be seen, in FIG. 3, the PEBP apertures decrease in size radially, there being one large aperture 45 at the central region of the plate, akin to the PEBP of FIG. 2. Concentric with the central aperture 45 is a set of six apertures 46A–46F, each being approximately threesevenths in size to that of the central aperture. Concentric with apertures 46A–46F is another set of six apertures 48A–48F with the latter apertures being approximately one-half in size to the apertures 48A–48F. Also indicated by dashed circles is a possible wafer arrangement for RIE processing of a nineteen wafer batch. It should be understood that the arrangement of wafers is for illustration only and does not imply any fixed relationship between the wafer arrangement and the aperture pattern. In fact, any wafer arrangement occupying the same general area of the cathode would suffice for the purpose of this invention.

It should be further understood that, in accordance with the principles of the present invention, the relative sizes, shapes, density and pattern arrangement of PEBP apertures may be varied in accordance with the particular characteristics of the RIE chamber for which the PEBP is designed. Furthermore, asymmetric pattern arrangements of apertures, or arrangements for which the hole sizes vary with radius (e.g. increase, increase and then decrease), are within the scope of this invention. In addition, as will be described more fully hereinafter, an aperture arrangement or configuration is not necessarily unique for a given chamber but is to be designed such that it optimally compensates for the non-uniformity in etch rate of the particular chamber for which it is intended to be used.

Figure 6:
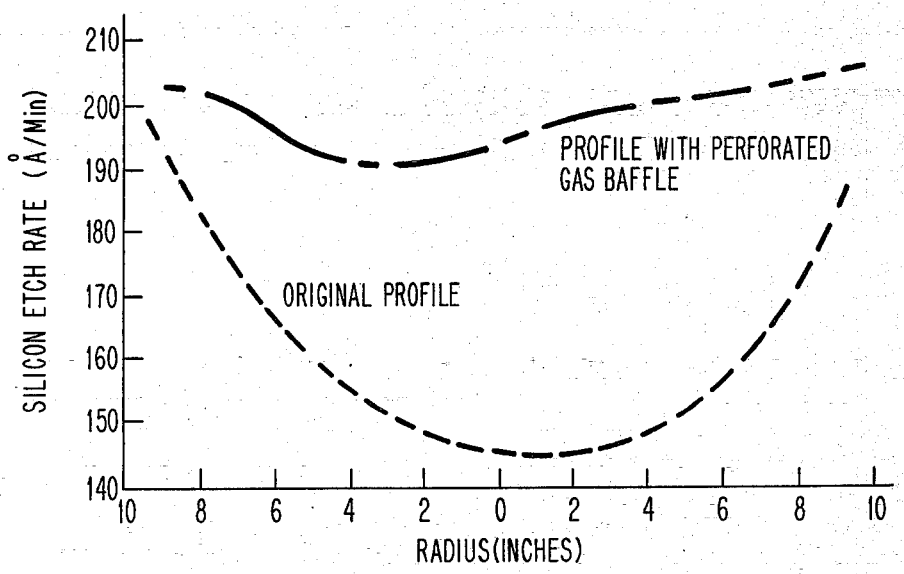
FIG. 6 shows plots of the silicon etch rate profile for both the RIE apparatus of FIG. 1 and the RIE apparatus of FIG. 2 with latter having perforations diminishing in size from the central region thereof, like those shown in FIG. 3.
Figure 4:
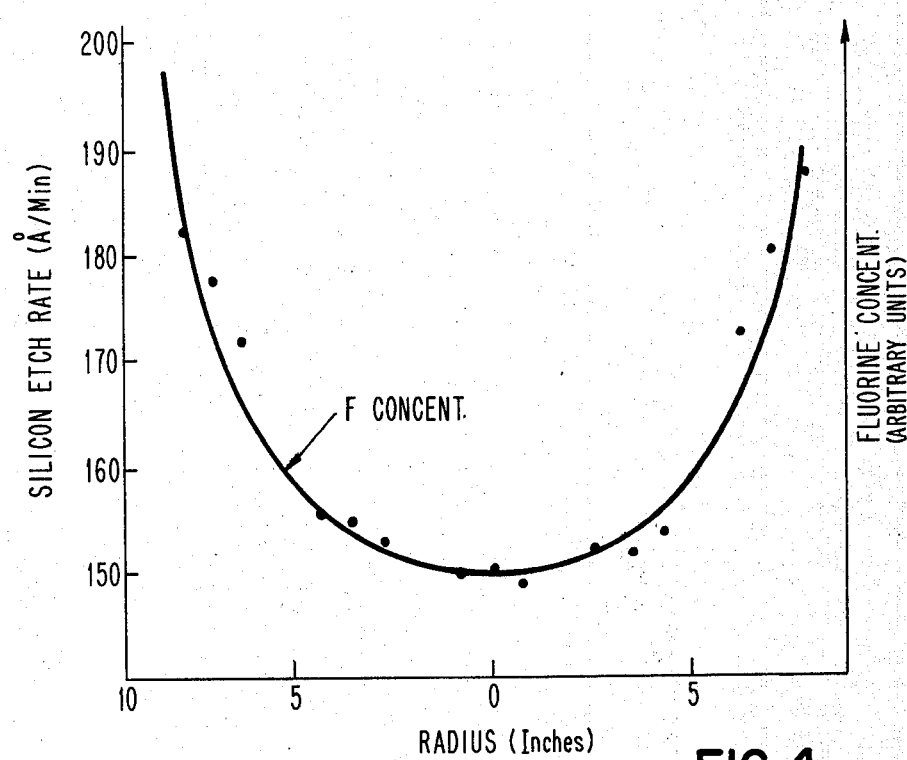
FIG. 4 shows a plot of the silicon etch profile across the cathode target of an RIE apparatus, like that shown in FIG. 1, without the plasma enhancing baffle plate in accordance with the present invention.
Figure 5:
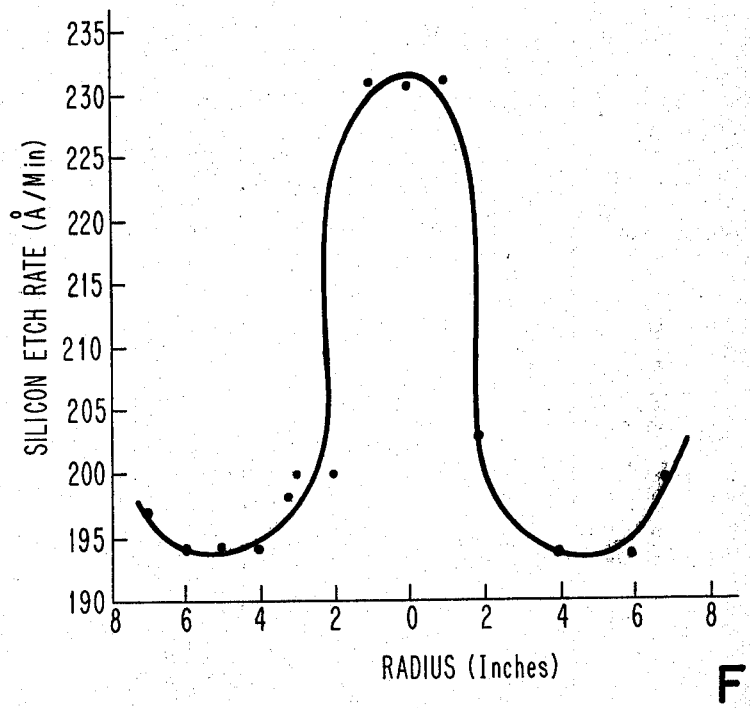
FIG. 5 shows a plot of the silicon etch rate profile across the cathode target of RIE apparatus, such as shown in FIG. 2, using a plasma enhancing baffle plate arrangement having one opening or perforation in the central region thereof.

The method of operation of PEBP 41 in FIG. 2 and the conditions under which its use is required to produce uniform etching will be best understood by reference to FIGS. 4–6.

FIG. 4 shows, as an example, the plot of the expected neutral fluorine concentration profile (F Concent.) across the cathode target 13 in the RIE apparatus shown in FIG. 1 under the conditions of etching silicon with $CF_4$. This profile was obtained through numerical calculation by assuming that fluorine is produced at a constant rate S in the entire plasma region 34A–34B of FIG. 1 by electron collisions with the gas $CF_4$ injected through gas feed 31, and that fluorine is only removed by combining with silicon to form $S_iF_x$ at the silicon wafers 25 on target cathode 13 or, alternatively, at the surface of pallet 27 where latter is, for example, constructed of silicon. The fluorine concentration density n at any point within the chamber then satisfies the diffusion equation:

$$\vec{nu} = D\vec{\nabla}n$$

where $\vec{u}$ is the net flow velocity of the fluroine, D is the diffusion coefficient, and $\vec{\nabla}$ is the standard gradient operator. In addition, the continuity equation $\vec{\nabla}\cdot\vec{nu}=S$ is satisfied. These combined yield $\nabla^2 n = S/D$ (Poisson's equation) which can be solved by standard numerical techniques with the boundary conditions n=0 for fluorine removing surfaces, such as silicon, and $\nabla n = 0$ for chamber surfaces which do not remove silicon, such as stainless steel.

The shape of the fluorine concentration curve shown in FIG. 4 may be explained by the following simple model. Fluorine is produced everywhere within the plasma regions 34A and 34B shown in FIG. 1. Under steady state situations, the fluorine produced in region 34B must diffuse into the target region 34A, where it is eventually removed by combining with the silicon. In order for this diffusion to occur, a fluorine concentration gradient is set up with the fluorine concentration increasing radially out from the center of target cathode 13.

The importance of the effect of fluorine species concentration on etch rate may best be understood by considering RIE etch mechanisms. Generally, in RIE there are two major elements: (1) a source of positive ions, such as $CF_3^+$, $F^+$, which are accelerated across the cathode sheath 37 from the plasma region 34A to the exposed surfaces of wafers 25 and which provide energy to the etch process, and (2) a chemical species, such as $F, F^+$, which can combine with the etched species, such as silicon, forming a volatile compound, such as $SiF_4$, which is removed by pumping via port 29. For some reactions these two species are the same. The relative importance on etch rate of the ion component versus the neutral component in an RIE etch system will depend strongly on the etchant gas and the material being etched. For example, in RIE of silicon in a $CF_4$ plasma, the etch rate depends strongly on the fluorine concentration (or other active fluorine radicals) while in RIE of $SiO_2$ in a $CF_4$ plasma the etch rate is dominated by ionic (most likely $CF_3^+$) concentration and depends much less on the neutral fluorine concentration.

It is to be understood that while the above discussion of etch rate non-uniformity due to concentration gradients of neutral etching species is directed to the examples of etching silicon using $CF_4$, the problem of etch rate non-uniformity due to concentration gradients of neutral etching species is general to any similar etching process, i.e. one for which the etch rate depends on the presence of a neutral species produced within the plasma. In fact, for such systems with a uniform plasma density, the etch rate will be proportional to the neutral species density.

In FIG. 4 there is also shown measured etch rate points using silicon wafers and $CF_4$ as the etchant gas. Measurements were made (three measurement points per wafer) on five wafers arrayed along a diameter of a cylindrical target cathode, similar to that shown in FIG. 1. These etch rate points were obtained using a pressure of $40\mu$, a flow rate of 25 SCCM, an RF power of 400 watts and an RF frequency on the order of 13.56 MHz. The batch uniformity in etching silicon under such conditions was found to be ±39 percent. As can be seen, the series of points representing the measured silicon etch rate at various radial points on the cathode surface follow closely the calculated neutral fluorine concentration profile.

This close correspondence indicates that in order to achieve etch uniformity over a relatively large area, such as required in batch processing, it is necessary to increase the active species in the central region of the cathode target. In accordance with the present invention, it has been found, as hereinabove described, that by positioning plasma enhancing baffle plate (PEBP) 41 between the anode 3 and the cathode target 13, uniformity in silicon etching can be substantially increased.

As shown in FIG. 2, the PEBP is positioned in relatively close proximity to anode 3 to form region 43. The distance between the anode and PEBP may vary up to a distance equal to 25 percent of the PEBP diameter but should, in no event, be more than 50 percent of the distance between anode and cathode. Thus, for a typical PEBP of 20 inches in diameter, the spacing between anode and PEBP should be no more than 5 inches but in no event more than half the distance from anode to cathode. The minimum distance or spacing between anode and PEBP, on the other hand, should be no less than 10 to 20 Debye lengths since spacing less than this will start to extinguish the plasma. A typically good operating distance between anode and PEBP is approximately one inch.

FIG. 5 shows a measured etch rate profile where a PEBP with only one large central perforation is employed, such perforation being akin to perforation 45 in FIG. 3. As can be seen, the etch rate sharply peaks to approximately 230 Å per minute at the central point of the cathode target, there being a sharp drop-off in etch rate approximately two inches from the center of the target. Typically, such an etch rate profile is achieved using a PEBP aperture diameter of from 1.5 to 2 inches with the high etch values observed on the target at the point opposite the center of the aperture. As described above, this enhanced etch rate is apparently due to an increased etchant concentration in the target region beneath the aperture. The reason for this is postulated as follows.

The presence of the PEBP 41, in FIG. 3, leads to an enhanced plasma glow in the region 43 between the PEBP and the anode 3. One condition necessary for this enhanced plasma glow to occur is that the PEBP has apertures with opening dimensions considerably greater than the plasma Debye length. Under such a condition, the plasmas in regions 43 and 34 are closely coupled and the anode area of the system is increased by the total surface area of the PEBP 41. This has two effects. First, many RF field lines (and hence the ionizing currents responsible for producing both the neutral and ionized constituents of the plasma), which originally terminated at the outside of the chamber on grounded surfaces, now terminate on the added anode surfaces 41A and 41B, leading to an enhanced neutral species creation rate in the chamber both just below the PEBP and in the enclosed plasma region 43 above. Furthermore, since the ionizing currents must pass through the apertures to reach anode surfaces 41A and 4, the ionizing currents are constricted in the region of the apertures and the enclosed region 43, leading to regions of increased production of neutral species in both these regions.

These apertures now represent an enhanced source of etchant species which may be adjusted over the target area by adjusting aperture locations, number and sizes.

It is clear that, in accordance with the above teachings, the effect of aperture arrangement on etchant species may be calculated and the aperture designed to produce high etch rate uniformity in accordance with the particular characteristics of the system.

However, it has been found simpler to use an empirical method to design the PEBP. For a given chamber geometry, a single aperture, akin to aperture 45, is employed in the PEBP as a starting point. From etch rate results similar to those presented in FIG. 4, the effect of this single aperture on the etch rate profile for the chamber design and plasma conditions is estimated. Then, a series of smaller holes akin to apertures 46A-46F and 48A-48F are added over target regions with the lowest etch rate, with the sizes estimated using the single aperture data. If needed, a further set of holes, akin to 50A-50F, may be added, again using data derived from the previously constructed design to set aperture location and size. Iterations of this process are repeated until uniformity suitable for the particular RIE system in question is obtained. It has been found that, typically, three to four such iterations are required to reach an etch rate uniformity of five to eight percent over a 19 wafer batch of silicon wafers etched in $CF_4$.

FIG. 6 shows a silicon etch rate profile both with and without the use of a PEBP. The silicon etch rate profile without the use of the PEBP is designated "original profile" in FIG. 6. The profile characteristic shown in FIG. 6 with the use of the PEBP represents the results obtained using a baffle plate akin to that shown in FIG. 3, typically a plate 20 inches in diameter in a 28-inch diameter chamber. Typically, in such an arrangement a cathode target of 20 inches is employed and, as shown in FIG. 3, 19 silicon wafers of, for example, 82 mm dimension are closed-packed in the central region of the target cathode. An interelectrode spacing of approximately three and one half inches was utilized and the initial evacuation level typically would be $5 \times 10^{-6}$ torr. A chamber pressure of 40 microns and a fluoride containing gas, such as $CF_4$ flowing at 25 SCCM, may be employed. An RF power source operating at a frequency on the order of 13.56 MHz was used to deliver power on the order of 400 watts, providing a DC voltage to cathode target 13 on the order of $-300$ volts.

The concentric rings of perforations extending outwardly from central perforation 45 act to spread or flatten the etch rate profile shown in FIG. 5 wherein only perforation 45 was employed. By so doing, the distribution of the etchant species caused by the perforations is further spread outwardly from the center of the target in a manner to compensate for the deficiency of species in prior art RIE chambers, as depicted by the profile in FIG. 4. Accordingly, this compensation acts to cause the etch rate to be more nearly uniform over the radius of the cathode target, as shown in FIG. 6.

It is clear from above discussion that specific baffle configurations may be designed to meet particular applications whereby the etch rate over the entire cathode target may be made optimally uniform. Although specific parameters have been given in the examples above, it is clear that different etchant species, flow rates, chamber pressures and RF power levels may be utilized. It should also be understood by those skilled in the art that although the description has centered on the use of the plasma enhanced baffle plate for etching applications wherein etching is dominated by neutral species, the plasma enhanced baffle plate may as readily be employed to attain enhanced uniformity in any etching application in which the neutral species component has an appreciable effect.

While the invention has been particularly shown and described with reference to the preferred embodiment thereof, it will be understood by those skilled in the art that various changes in form and detail may be made therein without departing from the spirit and scope of the invention.

What is claimed is:

1. In a reactive ion etching system including anode and target cathode means adapted to be biased to create an ionized plasma within a reaction chamber having ion species and neutral etching species, the improvement comprising a plasma enhancing baffle plate electrically coupled to said anode and arranged to form a constricted chamber region between said anode and baffle plate with said baffle plate being at least as close to said anode than as to said cathode and with said constricted chamber region being open to said reaction chamber through aperture means in said baffle plate to permit said plasma to be generated within said constricted chamber region such that the total surface area of said anode is increased thereby acting to increase the creation and distribution of said neutral species.

2. The system as set forth in claim 1 wherein said aperture means comprise a plurality of apertures.

3. The system as set forth in claim 2 wherein said aperture means comprise a plurality of apertures decreasing in size from the central region of said baffle plate outwardly.

4. A reactive ion etching system for etching material through chemical and ionic action, said system including anode means and target cathode means adapted to be biased to form an electric field therebetween within a reaction chamber which acts to create a plasma containing ion species and neutral etching species, the improvement comprising;

plasma enhancing baffle plate means electrically coupled to said anode means and arranged to be a distance from said anode means no greater than half the distance between said anode means and said cathode means so as to form a constricted chamber region between said anode means and said plasma enhancing baffle plate means, said plasma enhancing baffle plate means having aperture means therein which act to open said constricted chamber region to said reaction chamber and permit said plasma to be generated within said constricted chamber region over an enlarged anode surface area such that there is an increase in the creation and distribution of neutral species within said plasma.

5. The system as set forth in claim 4 wherein said baffle plate means is arranged so as to be no greater in distance from said anode means than 25 percent of the diameter of said baffle plate means.

6. The system as set forth in claim 5 wherein said aperture means comprise a plurality of apertures.

7. The system as set forth in claim 6 wherein said plurality of apertures decrease in size from the central region of said plasma enhancing baffle plate means outwardly toward the periphery thereof.

8. The system as set forth in claim 4 wherein said aperture means comprise a plurality of apertures.

9. The system as set forth in claim 8 wherein said plurality of apertures decrease in size from the central region of said plasma enhancing baffle plate means outwardly toward the periphery thereof.

* * * * *